United States Patent [19]
Slonczewski

[11] Patent Number: 5,695,864
[45] Date of Patent: Dec. 9, 1997

[54] ELECTRONIC DEVICE USING MAGNETIC COMPONENTS

[75] Inventor: John Casimir Slonczewski, Katonah, N.Y.

[73] Assignee: International Business Machines Corporation, Armonk, N.Y.

[21] Appl. No.: 535,415

[22] Filed: Sep. 28, 1995

[51] Int. Cl.$^6$ .................................................. B32B 15/00
[52] U.S. Cl. .......................... 428/212; 428/216; 428/65.3; 428/65.5; 428/611; 428/652; 428/653; 428/671; 428/672; 428/673; 428/675; 428/676; 428/692; 428/900; 324/252; 338/32 R; 360/86; 360/97.01; 360/135; 360/113
[58] Field of Search ................................. 428/212, 216, 428/611, 671, 672, 673, 675, 676, 652, 653, 692, 65.3, 65.5, 900; 324/252; 338/32 R; 360/86, 97.01, 135, 113

[56] References Cited

U.S. PATENT DOCUMENTS

| | | | |
|---|---|---|---|
| 5,243,316 | 9/1993 | Sakakima et al. | 338/32 R |
| 5,313,186 | 5/1994 | Schuhl et al. | 338/32 R |
| 5,373,238 | 12/1994 | McGuire et al. | 324/252 |
| 5,422,571 | 6/1995 | Gurney et al. | 324/252 |

OTHER PUBLICATIONS

Y. Lassailly et al, The American Physical Society, Physical Rev. B, vol. 50, No. 17, 1 Nov. 1994–I, pp. 50–53, entitled "Spin–dependent transmission of low–energy electrons through ultrathin magnetic layers".

A. Fert et al, Journal of Magnetism and Magnetic Materials 140–144 (Feb. 1995) 1–8, entitled: "Layered magnetic structures: interlayer exchange coupling and giant magnetoresistance".

J.C. Sloncqewski, The American Physical Society, Physical Review B, vol. 39, No. 10, 1 Apr. 1989, pp. 6995–7002, entitled "Conductance and exchange coupling of two ferromagnets separated by a tunneling barrier".

T. Miyazaki et al, Journal of Magnetism and Magnetic Materials 139 (Jan. 1995) L231–L234, entitled "Giant magnetic tunneling effect in Fe/Al$_2$O$_3$ junction".

W.P. Pratt Jr., et al, Journal of Magnetism and Magnetic 126 (Sep. 1993) 406–409, entitled "Giant magnetoresistance with current perpendicular to the multilayer planes".

*Primary Examiner*—Stevan A. Resan
*Attorney, Agent, or Firm*—Stephen S. Strunck

[57] ABSTRACT

In the present invention, electrons flow through a free or excitable magnet, or reflect from it, to make its magnetization respond. To accomplish this, the spin vectors of the flowing electrons are preferentially polarized by an auxiliary ferromagnet, whose moment orientation is fixed. The electrons flow between the fixed and free ferromagnets through a non-magnetic metallic spacer which is thick enough to make the static inter-magnetic exchange coupling negligible. While transmitting thru or reflecting from the free ferromagnet, the spins of the moving electrons interact by quantum-mechanical exchange with the local, permanently present, spontaneously-polarized electron spins of the free magnet. This interaction causes a transfer of vectorial angular momentum between the several metallic layers in the device which causes the magnetization vector of the free magnet to change its direction continually with time. Thus excited, the magnetization vector will precess about its original axis. The precession cone angle will either attain a new equilibrium value which will be sustained by the current or will increase beyond 90° and precess with decreasing amplitude until the magnetization vector has reversed by 180° from its initial direction (i.e., switched).

56 Claims, 8 Drawing Sheets

ELECTRONIC DEVICE USING MAGNETIC COMPONENTS

BACKGROUND OF THE INVENTION

The present invention describes devices which rely on the purely microscopic quantum-mechanical phenomenon of exchange coupling between the spins of moving and bound electrons in a ferromagnet. The exploitation of exchange coupling in these devices makes possible unprecedented advances in speed and density in data storage and active integrated digital circuitry.

In contrast to the present invention, present-day applications of magnetism generally rely on macroscopic or mesoscopic magnetic phenomena. These phenomena depend on conventional magnetic concepts including B-H characteristics, permeability, coercivity, gyromagnetic ratio, magnetic domains and the like. Typically, the electric current in a wire induces a magnetic field and then the magnetic field acts on a ferromagnetic body in order to create the desired effect. Upon this conceptual framework rests the engineering of electric motors, bubble storage, and other magnetic devices.

SUMMARY OF THE INVENTION

This invention provides new means of dynamically remagnetizing or magnetically exciting a very thin ferromagnetic film, without the use of an externally applied magnetic field. In the present invention, electrons flow through a free or excitable magnet, or reflect from it, to make its magnetization respond. To accomplish this, the spin vectors of the flowing electrons must be preferentially polarized by an auxiliary ferromagnet, whose moment orientation is fixed by provided means. The electrons flow between the fixed and free ferromagnets through a non-magnetic metallic spacer which is thick enough to make the static inter-magnetic exchange coupling negligible. While transmitting thru or reflecting from the free ferromagnet, the spins of the moving electrons interact by quantum-mechanical exchange with the local, permanently present, spontaneously-polarized electron spins of the free magnet. This interaction causes a transfer of vectorial angular momentum between the several metallic layers in the device which causes the magnetization vector of the free magnet to change its direction continually with time. Thus excited, the magnetization vector will precess about its original axis. The precession cone angle will either attain a new equilibrium value which will be sustained by the current or will increase beyond 90° and precess with decreasing amplitude until the magnetization vector has reversed by 180° from its initial direction (i.e., switched). This form of magnetic excitation is called spin transfer. There are two modes of spin transfer, transmission and reflection, each having its preferred uses.

BRIEF DESCRIPTION OF THE DRAWINGS

Other features and advantages of the present invention will be apparent from the following description taken in connection with the accompanying drawings, wherein.

DETAILED DESCRIPTION OF THE INVENTION

It is a fundamental fact that the macroscopic magnetization intensity of a magnet such as iron arises from the cooperative mutual alignment of elementary magnetic moments carried by electrons. An electron is little more than a mass particle carrying an electrostatic charge which spins at a constant rate, like a planet about its axis. The electric current of this spin induces a surrounding magnetic field distribution resembling that which surrounds the Earth. Thus, each electron is effectively a miniscule permanent magnet. An ordinary permanent bar magnet, such as Alnico, consists of a collection of such microscopic magnets, electrostatically bound to the atoms, which are mutually aligned to provide the spontaneous polarization whose intensity and direction are measured by the macroscopic magnetization vector.

The exchange interaction is that force, arising quantum-mechanically from electrostatic interactions between spinning electrons, which causes this mutual alignment. Most quantum effects, such as electron momentum, have classical macroscopic counterparts in accord with the general Correspondence Principle. Exchange interaction is the one exception which has no classical counterpart. Not only does it couple the bound spins of a ferromagnet to each other, but it also couples the spins of moving electrons, such as those partaking in current flow, to these bound electrons. The present invention involves the novel use of the latter moving electron to bound electron exchange coupling to induce useful changes of magnetic state or magnetic excitation.

Figure 1:
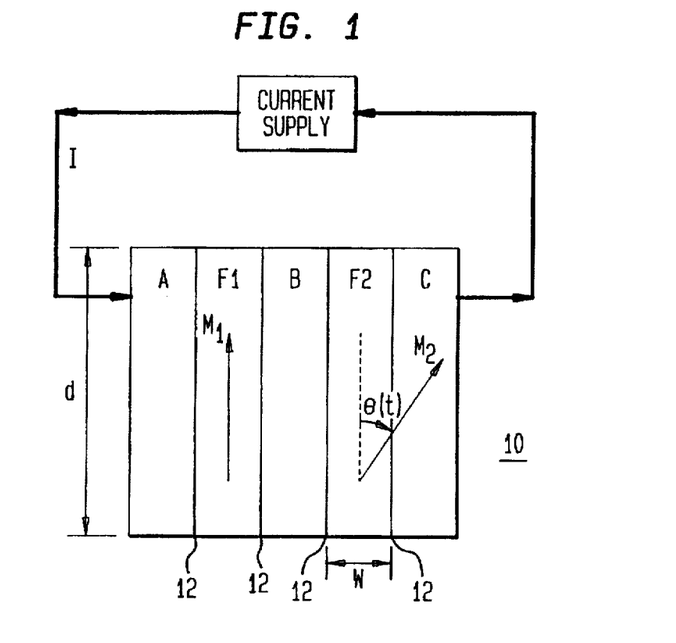
FIG. 1 is a schematic of an elementary five layer device of the invention illustrating spin transfer by electron transmission.

In the pentalayer device 10 of layer composition A/F1/B/F2/C of FIG. 1, all 5 regions are metals or are otherwise good conductors of electricity. Regions A, B, and C are non-magnetic metals, e.g. gold or copper. Region F1 contains a fixed magnet (spin polarizer). The magnet of region F1 may be a two-layer composite of an anti-ferromagnetic sublayer such as MnFe for exchange bias plus a polarizing sublayer of a good ferromagnetic or ferrimagnetic metal, such as Fe, Co, or Ni, or alloys including these elements. Or else, $F_1$ may be a single-layer metallic permanent-magnetic material such as BiMn, Alnico, or $RCo_5$ (R=Y, La, Pr, Nd, or Sm). Herein, the term magnet or magnetic will embrace both ferromagnetism and ferrimagnetism. The free-magnet region F2 will have one of numerous magnetic compositions to be specified below according to the nature of the application. Its macroscopic magnetization vector will be freer either because it lacks antiferromagnetic bias, has weaker anisotropy, has a smaller loss parameter, has a lesser thickness, or as a result of a combination of these factors. The directions of easy magnetization required in the layers F1 and F2 will also depend on the use to which the device is put as is explained in greater detail below.

It is known from electron-transmission experiments that the spins of an electron stream transmitted through a magnetic film become partially spin-polarized, as described by Lassailly, et al. in Phys. Rev. B, 50 (1994), which is herein incorporated by reference. Therefore, the spin vectors of electrons driven rightward (from layer A to layer C) through the pentalayer perpendicular to interfaces 12 between the layers by an imposed current are preferentially polarized, usually in the direction ($-M_1$), after passing rightward through the fixed magnet F1 into layer B in FIG. 1. The existence of spin-polarized electron-wave states and currents within non-magnetic spacers of magnetic multilayers similar to the pentalayer is known experimentally from inverse photo-electric measurements, the observation of oscillatory exchange coupling, and measurements of the so-called giant magnetoresistance (GMR), as described by Fert, et al., J. Magn. Magn. Mater., V140 (1995) p.1, which is incorporated herein by reference. Each of these effects depends on the presence of spin-dependent wave scattering at interfaces within the multilayer. The occurrence of these spin-dependent scatterings at the interfaces is a precondition for the present invention. Their experimental existence constitutes proof of its feasibility.

To-and-fro motions of thermally-equilibrated spin-polarized electrons through a non-magnetic spacer cause the well-known oscillations of conventional inter-magnetic exchange coupling versus spacer thickness in the absence of net current. It follows that an externally imposed flow of electric current causes a dynamic exchange of angular momentum between the two spin reservoirs contained in the two magnets.

The effect of this dynamic spin transfer is to cause the free moment $M_2(t)$ to rotate within the instantaneous plane determined by $M_2$ and the fixed $M_1$. The rotation rate $d\theta/dt$ versus the instantaneous angle $\theta$ shown in FIG. 1 is plotted in FIG. 2 for various values of the polarization factor P pertaining to the magnets (assumed alike). Their rate is calculated in the well-known Wentzel-Kramers-Brillouin (WKB) approximation of the Schroedinger wave equation for electron dynamics. The units for the vertical axis of FIG. 2 are $I/eN_2$ where I is the current, e is the electron charge, and $N_2$ is the total number of uncompensated localized electron spins forming the spontaneous moment of the free magnet F2.

Figure 2:
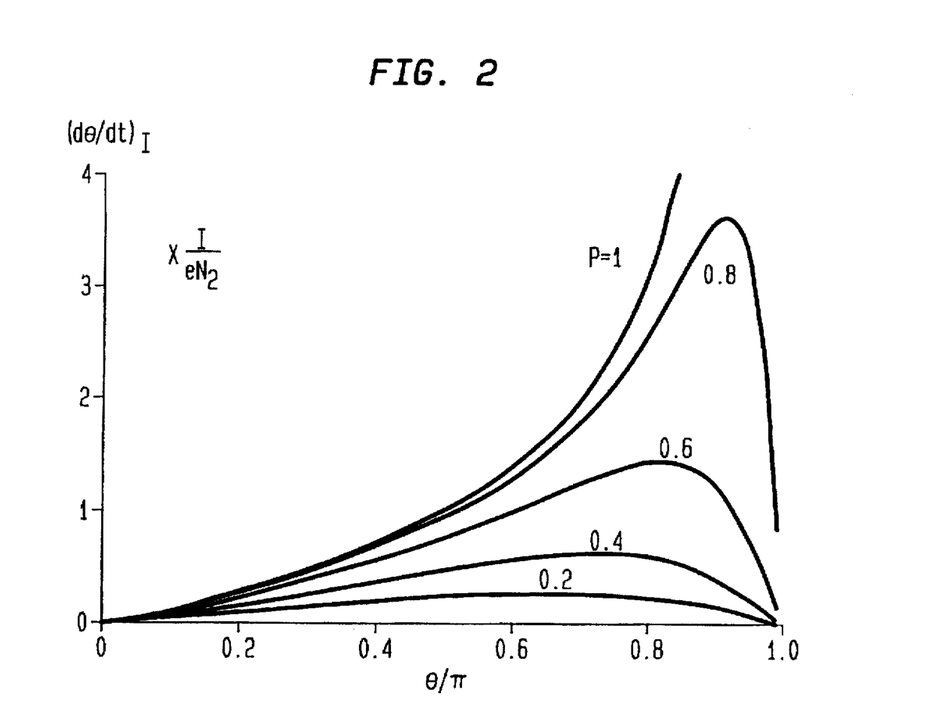
FIG. 2 is a graph of rotation rate of the magnetization vector of the free-magnet region (F2) of the device of FIG. 1 vs. the instantaneous angle θ(t) for various values of the polarization factor P.

The physical meaning of FIG. 2, in essence, is that the passage of each spin-polarized electron rotates the spin momentum vector of the free magnet by one quantum unit in order of magnitude. The rotation vanishes at angles $\theta=0$ or $\pi$, for which the component of transferred spin oriented orthogonal to the free moment vanishes. If P is small, or if the electron scattering in not coherent as assumed in the WKB approximation, the function plotted in FIG. 2 tends to a constant times $\sin \theta$.

The polarization factor, P, of a ferromagnet is a characteristic of the small number of electrons which are available for movement (in an electrical current) through the ferromagnetic body, namely those near the Fermi level which is the highest energy level occupied by any electron at absolute $T=0°$. At $T>0$, the occupation probability at the Fermi level is 50%. Of these electrons, the density of those whose spin direction agrees with that of the majority is written $n_+$. Likewise, the density of those electrons whose spin direction is opposed to the majority is $n_-$. P is the ratio of the net spin of these electrons pointing in the majority direction to the total, i.e., $P=(n_+-n_-)/(n_++n_-)$.

Measured values of the polarization parameter P, which appears in FIG. 2, are given for several magnetic compositions in Table I below:

TABLE I

| compos.: | $CrO_2$ | Fe | Co | Ni80Fe20 | Ni | Gd |
|---|---|---|---|---|---|---|
| P= | ≈1.0 | 0.40 | 0.35 | 0.30 | 0.23 | 0.14 |

The value $P\equiv1.0$ listed above for $CrO_2$, which is metallic for but one spin direction, was measured by photoemission. The remaining values in the table were determined by tunneling to superconductors. The polarization satisfies $|P|<1$ whenever energy bands for both signs of spin are metallic. Although the polarizations of NiMnSb and magnetite ($Fe_3O_4$) have not been measured, theoretically they should also be nearly 1 because they are both half-metallic magnets.

If $M_2$ is initially nearly parallel to $M_1$, then a current I having the correct sign so as to flow electrons from layer C to layer A perpendicular to the interfaces 12 between the layers will cause $\theta$ to increase with time at a rate predicted in FIG. 2. Other, passive energy-conserving effects such as local and shape-determined magnetic anisotropy energies, generally cause a rapid quasi-conical precession of the tip of vector $M_2$ about the axis of anisotropy. But switching, described by an increase of the cone angle, $\theta$, to the neighborhood of $\pi$, will occur if the current-imposed contribution to the cone-angle rate $d\theta/dt$ exceeds in magnitude the negative contribution due to the well-known spin-lattice relaxation and other loss mechanisms.

Reversing the sign of the current I will reverse the sign of the units of the vertical axis in FIG. 2, thus reversing the direction of this switching. However, as seen in FIG. 2, the switching effect is generally not symmetric geometrically. It is stronger per unit current near $\theta=\pi$ than $\theta=0$ because the passage of electrons having both signs of spin tends to be blocked when the magnets are nearly opposed to each other. Also, according to FIG. 2, switching cannot occur mathematically if the exact condition $\theta=0$ or $\pi$ holds initially, for then $d\theta/dt=0$. However, in practice considerable misalignments of crystal axes or thermal fluctuations will insure sufficient departures from this condition for switching to occur.

In the transmission mode of operation, the thickness $W_B$ of sublayer B must be less than the characteristic spin-diffusion distance $\lambda_{sd}$, otherwise the spin polarization of the conduction electrons will decay before they transit between the ferromagnets. This upper bound distance is believed to vary between about $\lambda_{sd}=100$ nm and about $\lambda_{sd}=1000$ nm depending on the composition of layer B. On the other hand, the thickness of B must be large enough to prevent the ordinary exchange coupling between F1 and F2 from interfering with operation of the device. For many spacer compositions, a lower bound thickness greater than about 3 nm will satisfy this condition.

Figure 3:
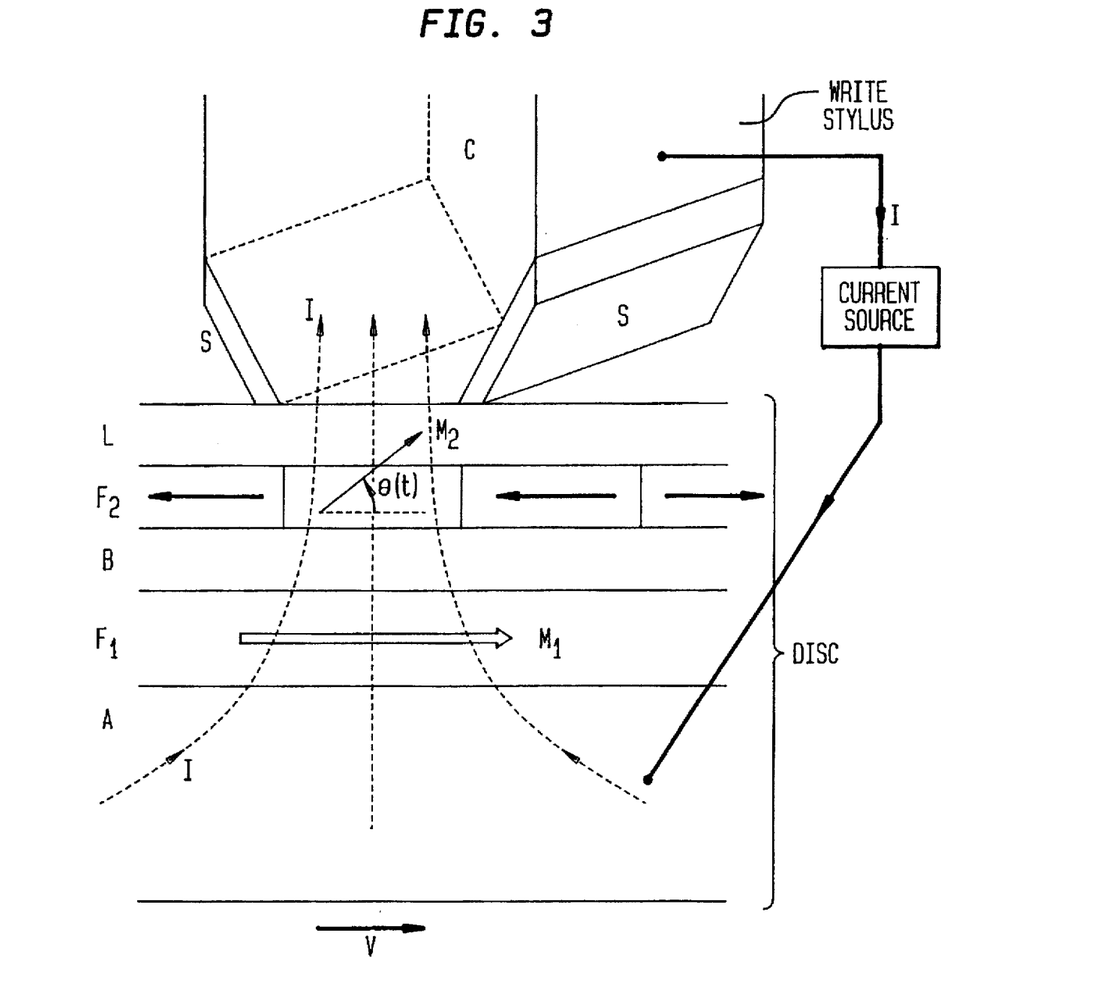
FIG. 3 is a schematic of a write only device employing the principle of spin transfer by electron transmission wherein the polarizer F1 is on the disk.
Figure 4:
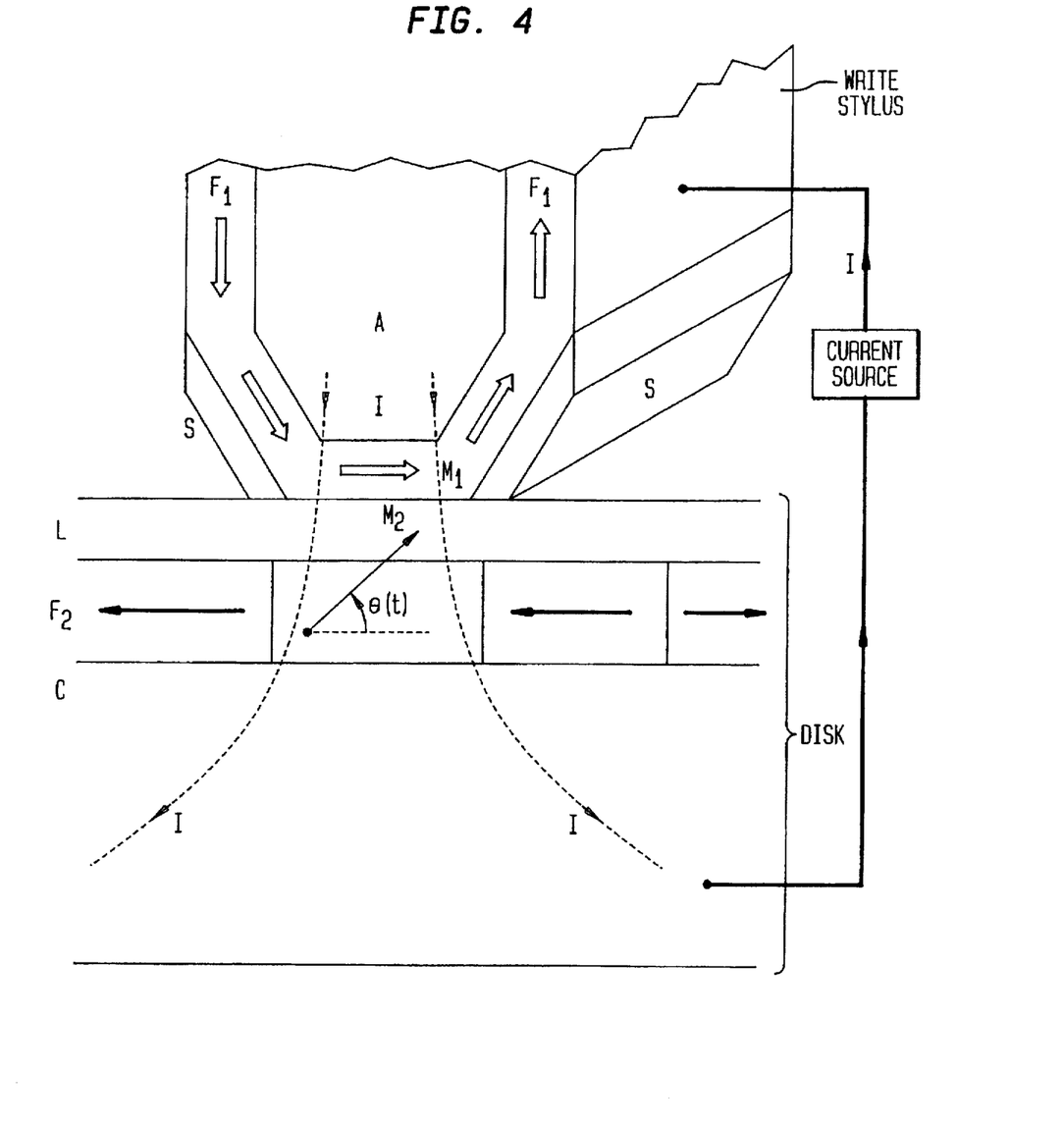
FIG. 4 is a schematic of a write only device employing the principle of spin transfer by electron transmission wherein the polarizer is on the stylus.

The principle of the invention described above is particularly suitable to the application of writing on a disk. In this case, the usual inductive write head is replaced with an electric stylus. The magnetization direction in the recorded pattern may be either parallel or perpendicular to the media plane. FIGS. 3 and 4 illustrate only the parallel case. There are two alternative device configurations for each case, i.e., the polarizer on the disk and the polarizer on the stylus.

FIG. 3 is for the case of the polarizer on the disk and shows a section of the layers A, F1, B, and F2 integrated on the disk. (Throughout this description, the notations A,B,C, F1,F2 in all figures are consistent with those in FIG. 1. The drawings are not to scale.) The reorientable layer F2 may be ordinary film recording media (e.g., $CrO_2$, $Fe_3O_4$) with consideration given to the measurable polarization factors P such as those of Table I to optimize spin-transfer efficiency. Region C is part of a stylus (shown in 3D projection), whose shape resembles the blade of a common screw driver, serving in place of the usual inductive write head. Its structure may vary, but in this example it has a solid shank portion of a non-magnetic conductor terminating in a wedge-shaped structure having shielding material (e.g., a NiFe alloy) on both elongated faces of the wedge-shaped structure. It makes sliding contact with F2 preferably through a layer of material, L, which facilitates the sliding contact such as, an ≅3 nm-thick film of metallic lubricant, such as mercury. Horizontal arrows shown in layer F2 indicate the data recorded digitally by pulses of current I while the media moves horizontally with respect to the stylus. The slanted Ni—Fe shield S shown fore and aft of C prevents disturbance of this recorded trace by the magnetic field induced by the pulsed write current I flowing vertically through the entire assembly. The dashed curves indicate the pattern of this current flow.

FIG. 4 is for the case of the polarizer on the stylus. Here, the device is inverted; only the layer F2 containing storage cells and the connector layer C are integrated on the disk. The storage layer makes sliding contact through layer B to the stylus which contains regions A and F1. Here, layer B may also be the lubricating layer L or L may be placed on top of layer B. The two magnetic shields marked S again function as previously. For the shield to function, the polarizer F1 on the stylus must be separated from the shield S by an insulating layer (not shown), e.g. $Al_2O_3$, SiO, or MgO, with thickness about 5 or 10 nm, which will serve to prevent conventional exchange coupling between F1 and S.

These novel devices exhibit very low power consumption and considerable device efficiency with acceptable heating over small distance scales. If the effective thickness of the layer with appreciable Ohmic dissipation is assumed to be 10 w where w is the F2 media thickness, the total power per unit area of storage cell, writing at some hundreds of MHz bit rate, is estimated by:

$$\phi = 40w^3 \rho (eM_{s2}/\beta\tau')^2 (P_1P_2)^{-3} \quad (1)$$

where ρ is the mean resistivity of the multilayer, e is the electron charge, β is the Bohr magneton of the electron, $P_1$ and $P_2$ are the polarization factors, and $M_{s2}$ is the spontaneous magnetization of magnet F2. The variable τ' is defined by $\tau' = (2\pi\Delta v + \tau^{-1})^{-1}$, where Δv is the ferromagnetic-resonance linewidth, and τ is the pulse width. For $\rho = 10^3 \mu\Omega cm$, τ'=1 ns, w=4 nm, and $M_{s2} = 10^3 G$ and $P_1 = P_2 = 1$, the power is about 10 $mW/\mu m^2$ for one storage cell. The form of this relation implies the existence of threshold current and power, corresponding to τ=∞, below which switching will not occur.

The amplitude j of the current pulse per unit of device area required for switching is estimated by:

$$j = 2ewM_{s2}/\beta\tau'(P_1P_2)^{-3/2} \quad (1A)$$

Assuming the same parameter values substituted above in Eqn. (1), the current density j=200 $mA/\mu m^2$ within the addressed storage cell.

Thus, not only is the expected power requirement of the spin-transfer write device tiny, but, if the polarizer is on the disk, most of the power is distributed over the bulky disk instead of being concentrated in the small write head. Also, the low duty cycle of a given storage location in the media implies a minimum of electromigration in spite of the large ($\cong 10^7 Acm^{-2}$) current densities flowing. The $\cong 1 mJcm^{-2}$ energy dissipated on the disk during one write operation is much too small to ablate the surface.

Placing the polarizer on the stylus causes much of the power to be dissipated there, but it has the complementary advantage of cost savings in the fabrication of a simpler disk. Apart from replacement of a conventional inductive write head, spin transfer by transmission will be suitable for implementing, in connection with storage devices, techniques using rotational or raster scanning with very finely pointed probes.

Figure 5:
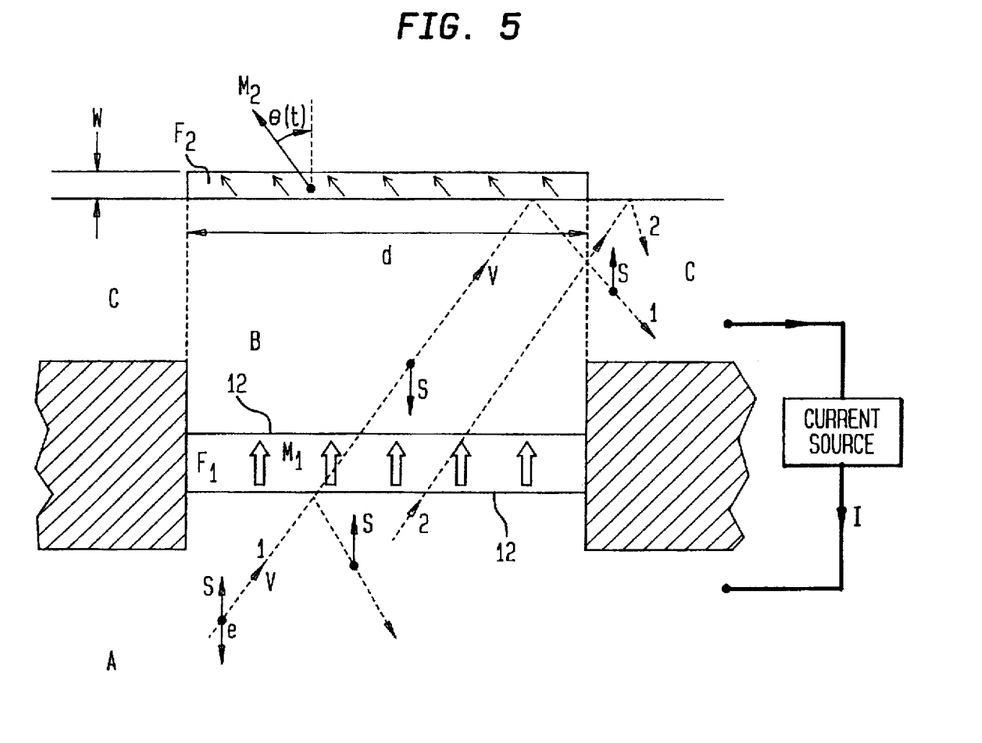
FIG. 5 is a schematic of an elementary device of the invention illustrating spin transfer by electron reflection.

The device is restructured as shown in FIG. 5 for operation in the reflection mode. The main difference is that now the connecting (contact) region C contacts the spacer B instead of magnet F2. Region C, which may be an extension of region B, is positioned to the sides in order to receive many of the electrons scattered from F2. (Aside from this change, the sequential layer notation A, F1, B, F2, C appearing in FIG. 5 follows the pattern established in FIG. 1.) Instead of the spin-polarized current flowing through a remagnetizable magnetic film F2, the presence of air or other insulator above it insures that most of it must now reflect from F2. The electron-exchange coupling involved in this reflection process transfers a part of the spin-angular momentum of the moving electrons to the magnet F2. The macroscopic effect of this spin transfer is again to excite the quasi-conical precession of the magnetization vector $M_2$ and dynamically vary the angle θ of this precession cone.

In the case of the switching operation in a memory cell or latch device, a current pulse I is supplied externally as indicated in FIG. 5. The rate of reversal of moment $M_2$ is again optimally on the order of one electron spin for each electron that flows through the input circuit from terminal A to terminal C. Realistically, this rate is diminished by three factors: 1) the less-than perfect polarizing power $P_1$ of the fixed magnet F1, 2) the probability p that an electron passing through F1 will, upon passing ballistically through the copper spacer B, impact on the switching magnet F2 and then scatter out of the device core into terminal C, and 3) the imperfect polarizing power $P_2$ of F2. The vertical dimension and one of the other dimensions of the spacer B should not be much greater than the mean free path, λ, of an electron, about 30 nm. This allows the electron dynamics of current flow to be substantially ballistic so that a large fraction of the flowing electrons scatters from F2. The epitaxial deposition specified below will insure that λ is near 300 Å for the preferred elemental spacer compositions Cu, Au, Ag and Al. Generally, the thickness of this layer should be in the range of about 3 nm to about 50 nm.

Two illustrative dashed electron-wave trajectories, labeled #1 and #2, are shown in FIG. 5. Trajectory #1, having velocity v, begins in the non-magnetic connector region A with spin s oriented up or down with equal probabilities. Then magnet F1 splits it into a reflected predominantly spin-up wave plus a transmitted wave with spin-down predominating to the degree $P_1$. Magnet F2, whose time-dependent moment $M_2$, forms angle θ(t) with $M_1$ held vertically by anisotropy, reflects or scatters the mostly spin-down electron wave downward with 100% probability because of the air or other insulator lying above it. The largest possible upward vectorial change of s due to this scattering event has the magnitude of the Planck constant h. The consequent recoil on $M_2$ is limited to $|\delta M_2|wd^2 \leq \beta$ where d is the diameter of region F2, w is its thickness, and $\beta$ is the Bohr magneton. More precisely, the corresponding change in $\theta$ due to scattering of one electron is $\Delta\theta = -(\beta P_2/M_{S2}wd^2) \sin \theta$, where the polarization coefficient $P_2$ measures the efficiency of this transfer. The factor $\sin \theta$ in this relation implies that this switching process is more nearly symmetric between the $\theta=0$ and $\pi$ orientations, unlike FIG. 2 which shows a skew towards $\theta/\pi=1.0$. The electron proceeds along trajectory #1 in its altered spin state to the terminal region C to complete the electric circuit. Alternatively, the electron might take a course like path #2 which does not strike F2 and leaves $M_2$ unaffected. Hence the relevant probability coefficient p satisfies p<1. The result is that the current I<0 causes switching from $\theta \equiv \pi$ to $\theta \equiv \pi$ by creating a long series of such small changes $\Delta\theta$.

When the sign of the current is positive (current flow from A to C), an unpolarized electron entering B from terminal C may partially reflect upward from F1 carrying predominantly up spin, thus causing $\Delta\theta > 0$ when it subsequently reflects from F2, with its spin now flipped to the down direction. Such spin down electrons pass more readily thru F2, closing the current circuit for this direction of current flow. The result is that a current satisfying I>0 causes switching from $\theta \equiv 0$ to $\theta \equiv \pi$.

As before, using $\tau' = (\tau^{-1} + 2\pi\Delta\nu)^{-1}$, and assuming that the polarization coefficients $P_1$, $P_2$, and the ballistic efficiency p enter inversely into the required switching current, it is possible to estimate the switching current for the switching time $\tau$ for $\theta$ to vary between the neighborhood of 0 to that of $\pi$. This results in:

$$I_s = 2eM_{s2}d^2w/\beta\tau P_1 P_2 p \quad (2)$$

where e is the electron charge, $M_{s2}$ is the spontaneous magnetization of magnet F2, d is the diameter of the device column, w is the thickness of layer F2 and $\beta$ is the Bohr magneton. With $M_{s2}=200$ G, d=30 nm, w=1 nm, $\tau'=1$ ns, $P_1=P_2=0.35$ and p=0.4, the switching current $I_s=200$ µA. The advantage of using small-moment ($M_{s2}$) compositions for magnet F2 is clear. The threshold current for switching is estimated by this equation with the special value $\tau=\infty$.

Since the circuit resistance is considered to be dominated by the ballistic resistance with a mean transmissivity $\overline{T}$ between terminals A and C shown in FIG. 5, the energy dissipated in one switch, well above threshold, is estimated by $$E_s = (12\pi/\tau\overline{T})(dwM_{s2}/k_f\beta P_1 P_2 p)^2 \quad (3)$$

Substituting the same parameter values as above for Eqn. (2), the switching energy $E_s$ $1\times10^{-16}$ Joule. This predicted trade-off between switching time and energy is competitive with that of advanced semiconductor devices. At the same time, Eq. (3) indicates a considerable latitude for further improvement by optimization of material and dimensional parameters.

Considering the current density $j=2\times10^7$ A/cm$^2$ passing through F1 using the nominal parameter values of Eq. (2), electromigration is a concern at ambient temperature. Long-lived ambient-temperature devices are obtainable by 1) avoiding grain boundaries through growing layers and contacts epitaxially, 2) developing higher-polarization magnets with low $M_s$, and 3) making the electrical connectors of gold, which is known to be highly resistant to electromigration.

The low energy dissipated in the devices of the present invention is in contrast to the large energy expended in the spin transfer thru a tunnel barrier, termed therein "dissipative exchange coupling", described by Slonczewski in Phys. Rev. B, vol. 39 (1989), p.6995. The rate of spin transfer is principally governed by the current I. Since the dissipated power is given by $\Phi = I^2R$, and I is about the same for a given rate of spin transfer, it follows that the resistance R of the spacer principally governs the power dissipated. But in quantum transport, $R \propto \overline{T}^{-1}$ where $\overline{T}$ is the mean transmission coefficient of an electron passing through the multilayer device. In the case where the spacer is metallic, $\overline{T}_m$ is estimated conservatively as $\approx 10^{-1}$. However, if the spacer is a barrier of thickness D such as $Al_2O_3$, then $\overline{T}_b \approx \exp(-2$ kD), where $\hbar k$ is the imaginary momentum which measures the size of the potential barrier, and D is the barrier thickness. In practice, the thickness must satisfy $D_> 1$ nm otherwise accidental bridges of magnetic material fill the "pinholes" in the barrier, creating a conventional exchange coupling between F1 and F2 which interferes with the operation of this invention. Since k=10 nm$^{-1}$, typically $\overline{T}_{b\leq} \exp (-20) \approx 10^{-6}$ and the power $\Phi$ is $T_m/T_b = 10^5$ times greater in the case of a magnetic tunneling junction. Therefore, the effect described in the above reference would not be practiced in any of the devices made possible by the present invention.

Figure 6:
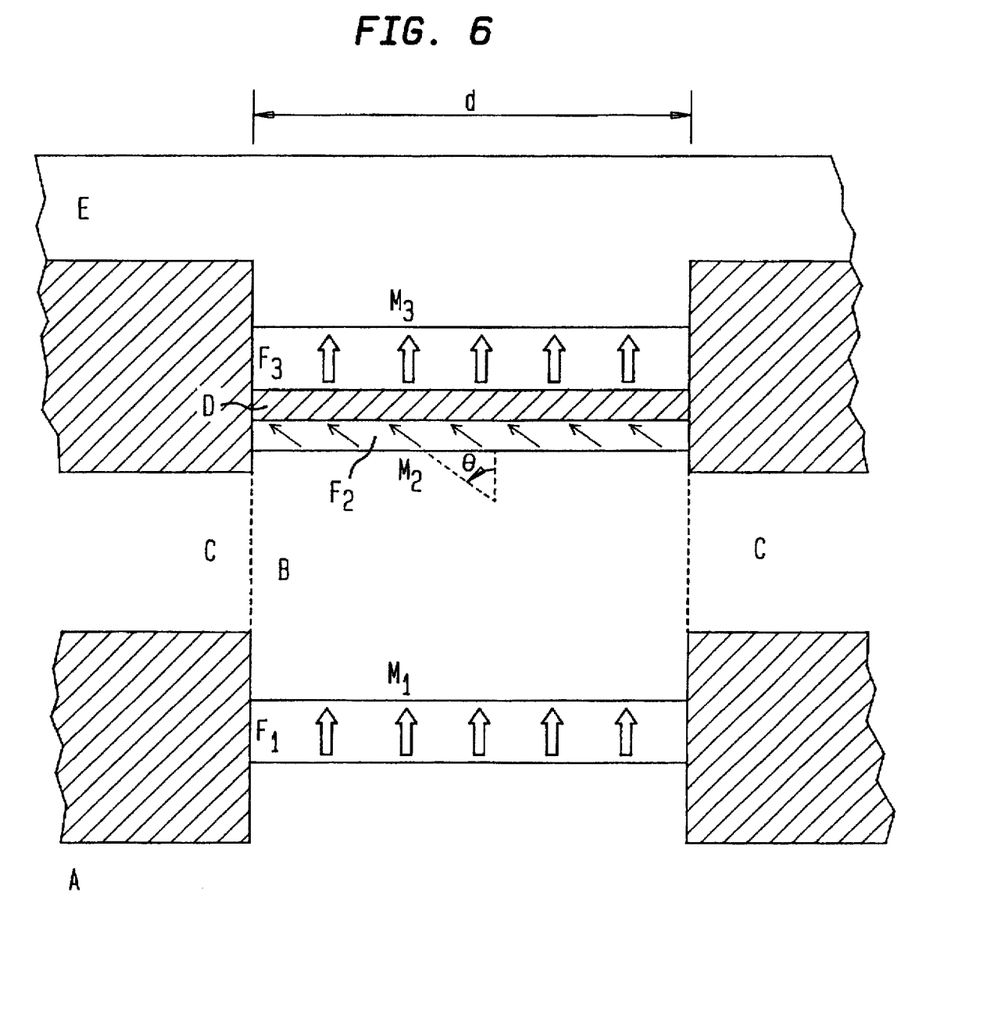
FIG. 6 is a cross-sectional view of a three terminal device based on reflection-mode spin transfer.
Figure 7:
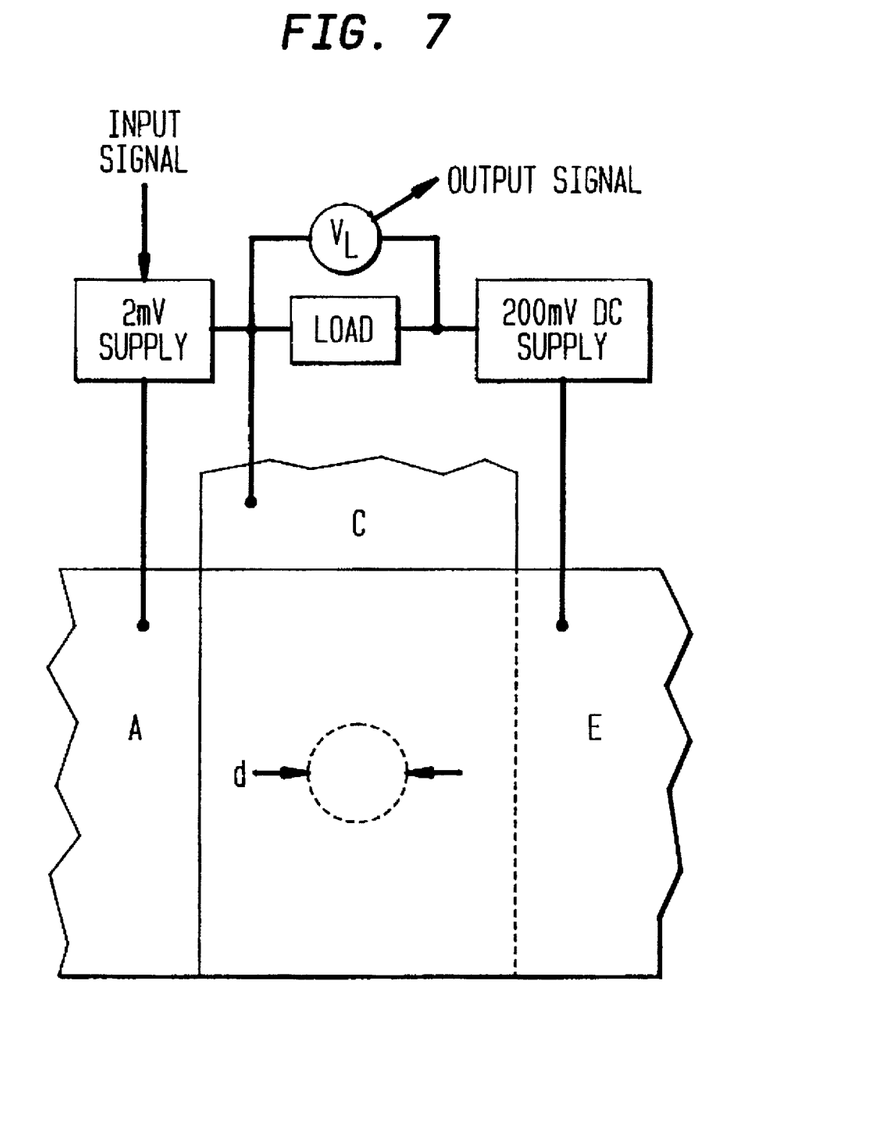
FIG. 7 is a top (plan) view of the device of FIG. 6 including a schematic of associated circuitry for latch function.

FIGS. 6 and 7 show cross-sectional and plan views of a 3-terminal device which illustrates uses of reflection-mode spin transfer. Depending on the nature of the connected circuitry and the orientations and strengths of magnetic anisotropy in the magnetic regions F1, F2, and F3, the device of FIG. 6 may serve as a memory cell, latch, logic gate, ac oscillator, or ac preamplifier.

The cross-section in FIG. 6 shows two partly overlapping stages of which the lower stage is the present invention shown in FIG. 5, and the upper stage is a magnetic valve of either the tunneling type (MTV) whose spacer is an insulating barrier such as is described by Miyazaki and Tezuka in J. Magn. and Magn. Mats., 139 (1995) L231, which is herein incorporated by reference, or the so-called CPP GMR type whose spacer is metallic as described by Pratt, et al., J. Magn. Magn. Mater., 126 (1993), p406, which is also incorporated herein by reference. This valve structure includes conducting layer B and magnet F2 of the lower stage.

It has three more layers in addition. Layer D, lying on top of F2 is an insulating tunnel barrier such as $Al_2O_3$ or one of a number of non-magnetic metals providing the so-called CPP-GMR magnetoresistive effect. Aside from providing the valve effect itself, the main requirement of this spacer is that its resistance is sufficient to limit the current during valve operation to a value well below the threshold for the switching action of the sort occurring in the spin-transfer stage. Layer F3, lying on top of D, is a fixed metallic magnet similar to F1, with its moment $M_3$ also permanently magnetized vertically.

Layer E is an electric connector such as Au or Cu. The performance of MTV and GMR valves is well-established by experiments. In essence, magnet F3 behaves as a spin-analyzer of the electrons passing through magnet F2 and spacer D. The conductance of the valve stage varies as $G = G_0 (1+\epsilon \cos \theta)$. Experiments demonstrate reproducible efficiencies exceeding $2\epsilon=10\%$ at ambient temperature.

FIG. 7 shows a plan view of the 3-terminal device on a finer scale. The circular (or square or other symmetric or asymmetric configuration) of the tower having diameter d in FIG. 6 appears only as a small circle in FIG. 7. Alternatively, the cross-section may be oblong, in which case d is the smaller in-plane dimension. A larger scale of lithography defines the external portions of the metallization for the three leads comprising terminals (or contacts or connecting regions) A, C and E, only small parts of which appear in FIG. 6. Each of the three terminals has the shape of a rectangular wire one of whose ends overlaps one end of each of the others and the two insulators within the square region seen in FIG. 7.

Figure 8A:
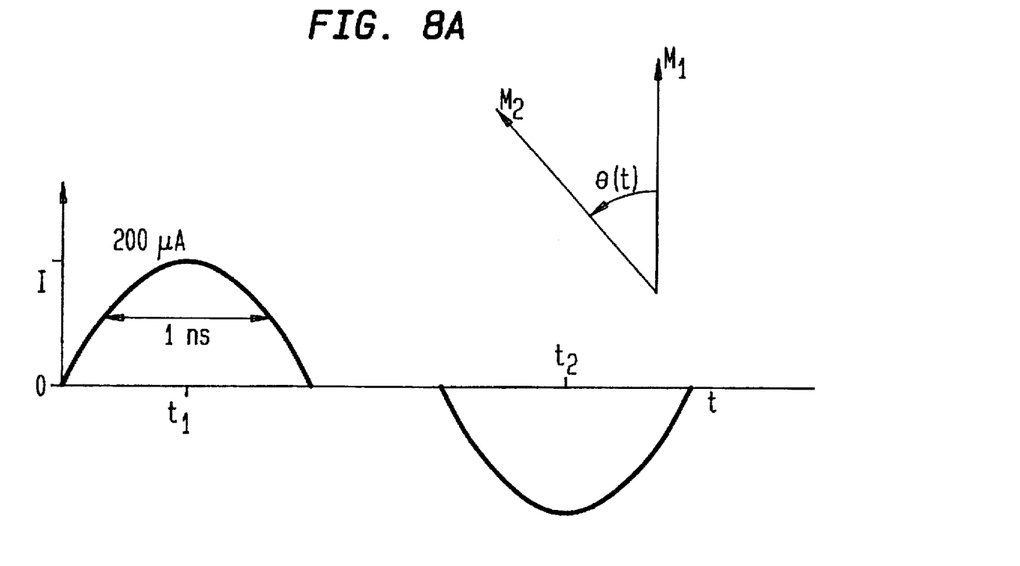
FIG. 8A is a graph of current versus time for input current pulses applied to the device of FIG. 7.
Figure 8B:
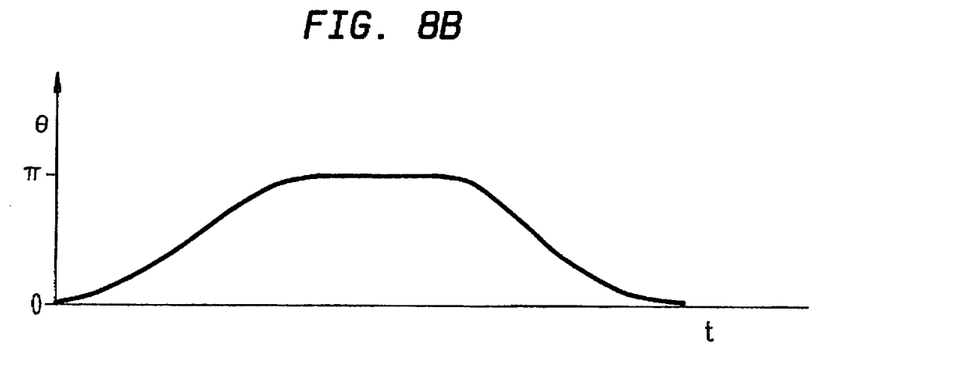
FIG. 8B is a graph of the precession-cone angle θ(t) as a function of time for the device of FIG. 7 in response to the input current pulses of FIG. 8A.
Figure 8C:
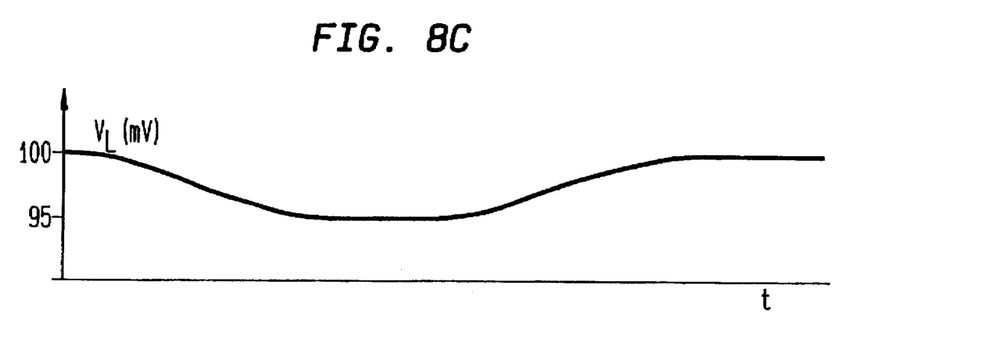
FIG. 8C is a graph of the voltage $V_L$ across the load of the device of FIG. 7 as a function of time.

Of the several types of device based on reflection-mode spin transfer using the structure of FIG. 6 and described later, the electronic circuit shown schematically in FIG. 7 illustrates the latch. It works in time as shown in FIG. 8. At time $t_1$, an input signal stimulates the 2 mV supply to produce a $\tau=1$ ns wide pulse in the input subcircuit causing a 200 µA current pulse to flow between terminals A and C. During this switching time $\tau$, electrons polarized by magnet F1 flow through the "exchange chamber" B and effect the increase of the precession-cone angle $\theta(t)$ of the moment $M_2(t)$ $\theta \cong 0$ to nearly $\pi$. (This moment $M_2$ is meanwhile pseudo-Larmor processing about the film normal under the influence of the uniaxial anisotropy at a variable rate generally greater than $\tau^{-1}$.) In the meanwhile, this change of $\theta$ causes $\cong 10\%$ net increase in the tunnel resistance of layer D, in accordance with the well-established MTV effect. As a result, the voltage $V_L$ across the load decreases from 100 nm by 5 mV; the sense circuit senses this signal and passes it to the next stage of a network (not shown). A subsequent pulse of reversed sign at time $t_2$ in FIG. 8 restores the original direction of $M_2$ and therefore the initial 100 mV level of the output signal.

The operation described constitutes a latch circuit. Equation (2) implies that there is a current threshold below which switching will not occur. Therefore, inputs can be combined in digital fashion to use this form of the device to provide memory and logic operations including devices such as AND gates.

The easy uniaxial anisotropy energy $K_{U2}$ of F2 must be sufficiently strong to block reversal of $M_2$ through thermally excited domain wall motion according to the inequality $$d > 25 k_b T / w A_2^{1/2} (K_{u2} - 2\pi M_{s2}^2)^{1/2} \quad (3A)$$

where T is the absolute temperature, $k_B$ is Boltzmann's constant, and $A_2$ is the exchange stiffness of F2. Substituting T=300K, w=1 nm, $A_2=10^{-6}$ erg cm$^{-1}$, $K_{u2}-2\pi M_{s2}^2=10^8$ erg cm$^{-3}$, the diameter d must exceed 10 nm for thermal stability of the stored bit and the magnetization $M_{S2}$ must be small to keep the switching current (2) small.

The 3-terminal reflective-spin-transfer device shown in FIGS. 6 and 7 has various uses requiring different circuit characteristics and combinations of magnetic parameters and preferred-axis orientations. The magnetic geometries for the three uses are shown schematically in FIG. 9. They are a) memory or latch (discussed above), b) oscillator, and c) analog preamplifier. The descriptions and specifications are as follows.

Figure 9A:
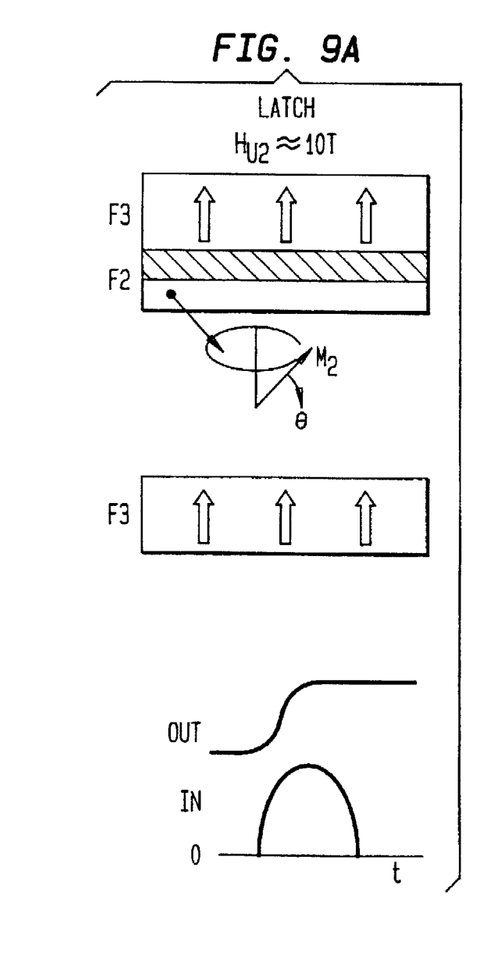
FIG. 9A is a graph of the configuration of the device of FIG. 6 which functions as a latch unit.

For the memory, latch or logic gate of FIG. 9A, the preferred axes of the 3 magnets F1, F2, and F3 are all "vertical" (i.e., in the same direction or orientation) as discussed above. Other orientations can serve as long as they are parallel to the same axis.

Figure 9B:
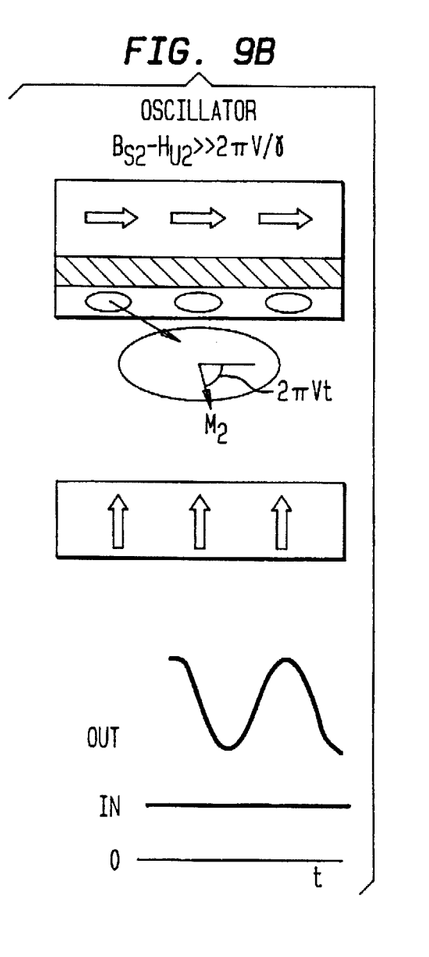
FIG. 9B is a graph of the configuration of the device of FIG. 6 which functions as an oscillator.

For the tunable oscillator of FIG. 9B, the oscillations are obtained from the steady precession of $M_2$ at some frequency $\nu$ within the midplane of the film. That is, the precession cone with $\theta$ having a constant value near 90° degenerates to nearly plane. To stabilize this in-plane orientation, the combination of demagnetization and uniaxial material anisotropy $H_{U2}(=2K_{U2}/M_{S2})$ must be negative. Either one of two conditions must be satisfied: $B_{S2}-H_{U2} \gg 2\pi v/\gamma$, or a vertical external magnetic field $H_{DC}=2\pi v/\gamma$ is needed as provided by, for example, a permanent magnet (not shown in FIG. 9B).

In the former case, one may use iron for F2, for which the experimental loss parameter is $\alpha=3 \times 10^{-3}$. For the vertically magnetized polarizer F1, one may again use epitaxial RCo$_5$ as in the memory cell above.

The input current, of density j, energizes the precession, whose frequency is tuned by simple proportion to j, for j exceeding some threshold depending on the strength of in-plane anisotropy. Above this threshold, the frequency is given by:

$$v = j P_1 P_2 p / e \alpha M_{S2} w \quad (4)$$

where $P_1$ and $P_2$ are polarization factors such as those in Table I, p is the probability of an incident electron closing the circuit, $\alpha$ is the Gilbert damping constant, $M_{s2}$ is the spontaneous magnetization of magnet F2, and w is the thickness of layer F2. Substituting $j=10^7$ Acm$^{-2}$, $P_1=0.3$, $P_2=0.4$, $\rho=0.4$, $\alpha=3 \times 10^{-3}$, $M_{s2}=1700$ G, and w=1 nm, the oscillator frequency $v=10$ GHz. The fixed direction of $M_3$ in F3 is now horizontal in FIG. 9B, so that the output voltage becomes proportional to the corresponding component of the processing $M_2$. The layer F3 may be iron with an overlayer of MnFe to permanently fix the magnetization direction.

Figure 9C:
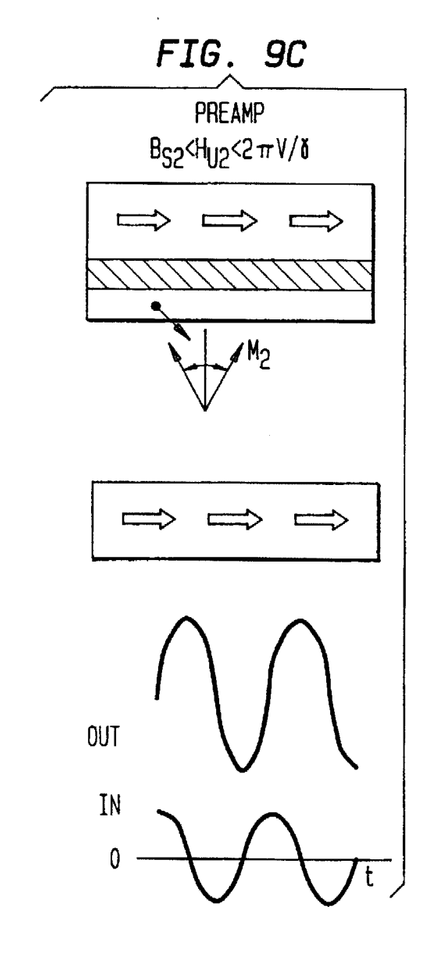
FIG. 9C is a graph of the configuration of the device of FIG. 6 which functions as a preamplifier.

In the preamplifier of FIG. 9C, the input voltage carries an AC input signal with frequency $\nu$. Essential are the conditions that $M_1$ is parallel to $\pm M_3$ and that the direction of $M_2$ at rest is orthogonal to $M_1$ and $M_3$. This geometry maximizes the angular velocity $|d\theta/dt|$ and the output signal. Thus, $M_2$ oscillates in one plane about a mean direction orthogonal to $M_1$ and $M_3$. The oscillation plane for $M_2$ contains $M_1$ and $M_3$. In other respects, the orientations are a matter of practical convenience.

An example of a feasible fabrication procedure for the devices of this invention, here particularly the device structure of FIG. 6 having magnetic geometries and functions of FIG. 9 follows. For layers A, F1, and B, it utilizes when possible epitaxial evaporation common for (111) Cu/Co and Au/Co multilayers, and/or epitaxial sputtering used for (111) orientations of Cu, Co, Ni, or Ag. Epitaxy insures the ballistic electron motion needed in layer B. The procedure is:

1. Begin with a (011) GaAs (for evaporation) or Al$_2$O$_3$ (0001) (for sputtering) substrate.
2. Deposit, without masking, the sequence of layers comprising the central column of the device shown in FIG. 6;
   a. Layer A: Epitaxial copper or gold.
   b. Layer Fi: About 5 nm of permanently magnetized epitaxial hexagonal high-moment RCo$_5$. (R=Sm, Y, La, Pr, or Nd) for latch (a) or oscillator (b). For preamplifier (c), CrO$_2$, NiMnSb or Fe/MnFe bilayer, without epitaxy, may be used.
   c. Layer B: About 20 nm of gold or copper to serve as the "ballistic chamber" for spin exchange between F1 and F2. This layer should be epitaxial for the memory or oscillator and will be non-epitaxial for the preamplifier.
   d. Layer F2: For the memory device, about 1 nm, but not more than about 10 nm of the free epitaxial low-moment R'Co$_5$ where R'=Gd,Tb, or Dy. For the oscillator, Fe, which has the nominal parameters of Eqn. (4), is used. For the preamplifier, one of many compositions of Gd—Co—Mo amorphous-bubble material giving vertical orientation is used.

e. Layer D: About 1 or 2 nm of alumina, $Al_2O_3$ or other non-magnetic insulator. The thickness of this layer is adjusted to obtain desired tunneling resistance for MTV operation in the output circuit.

The remaining depositions will not be epitaxial.

f. Layer F3: About 5 nm of permanently magnetized $RCo_5$ is used for the memory device. For the oscillator, the bilayer Fe/MnFe is used to obtain in-plane orientation and for the preamplifier, the same material as was used in layer F1 is used.

g. Layer E: About 30 nm gold or copper for the electrodes.

Deposition of the 3 magnetic layers described above requires:

a. Low substrate temperature to prevent decomposition of $RCo_5$ and $R'Co_5$.

b. Maintenance of a magnetic field during deposition of fixed magnetic layers F1 and F3 to predetermine the static magnetization directions in accordance with the device functions indicated in FIG. 9.

3. By means of e-beam or x-ray lithography, define the column.

4. Etch or ion mill away material surrounding the column to a depth of about 10 mn below the bottom of F1.

5. A coarser scale lithography and registration (e. g. 1 μm) is used to define the lead wires shown in the plan view of FIG. 7. An insulating layer, 15 nm of copper connector C, a second insulating layer, and (after planarization) a thicker copper connector E are deposited in succession. (Several nanometers of tolerance are present in the vertical positioning of the four horizontal interfaces of the insulators.) Following each deposition of insulation and of connector E, the small amount of unwanted material which was deposited on the vertical sides of the central column must be dissolved or etched away.

In case the magnetic materials have tetragonal crystalline symmetry, a (100) GaAs substrate is required instead of (011), and fourfold crystallinity or texture must be maintained during the multilayer deposition of the spin-transfer stage.

For the preamplifier wherein $M_1$ and $M_3$ lie in the film plane, epitaxy is not absolutely necessary because there is no threshold of current for operation of an analog device. Field-deposited $CrO_2$ or Fe/MnFe bilayers may be used for layers F1 and F3. The vertical orientation of the mean $M_2$ is obtained by sputtering one of many compositions of Gd—Co—Mo amorphous-bubble material well-known in magnetic bubble device technology. The main restriction is $0 < H_{U2} - B_{s2} < 2\pi v/\gamma$, which guarantees vertical orientation of $M_2$ at rest, and that precession does not interfere with the amplification mechanism. The voltage-gain-frequency product is estimated as $$Gv = e\beta k_F^2 V_B T P_1 P_2^2 P_3 p / 8\pi^3 \hbar M_{s2} w \quad (5)$$

where G is the voltage gain, v is the signal frequency, e is the electron charge, $k_F$ is the Fermi wave vector (estimated as 10 $nm^{-1}$), $V_B$ is the barrier voltage in the output circuit, T is the mean electron transmission coefficient in the input circuit, $P_1$, $P_2$, $P_3$ are the polarization factor for respective magnets F1, F2, F3, p is the probability of ballistic electron reflecting from F2, h is Planck's constant, $M_{s2}$ is the spontaneous magnetization of F2 and w is the thickness of layer F2, the gain-frequency product is Gv. Assuming $V_B = 0.1V$, $M_{s2} = 200$ G, $w = 1$ nm, $p = 0.4$, $P_1 = 1$, $P_2 = 0.3$, $P_3 = 1$, and $T = 0.1$, the gain-frequency product $Gv = 10$ GHz.

Application of the transmission mode of spin transfer to data storage advantageously provides writing at high frequency, high storage density, and low power.

In applications of the reflection mode of spin transfer to active integrated computer and communications circuitry, high circuit density, high-frequency operation, low supply voltage, and low switch energy is achieved. In addition, the cooperative nature of ferromagnetism or ferrimagnetism provides non-volatility, radiation resistance, and a high degree of thermal stability in a small memory cell, which are desirable in military and space applications. When fabricating devices with lithography linewidth in the 10–100 nm range, there is the low expense implied by the need for only a single mask for the core of the device, instead of the minimum of 4 mutually registered masks needed for the core of a comparable semiconductor device. The lithography for the interconnections and the tolerance of their registration to the magnetic core can have larger and less costly dimensional scales, if desired.

Having thus described the preferred and other embodiments of the present invention, it will be understood that changes may be made in the size, shape and configuration of the parts described herein without departing from the present invention as recited in the claims.

Having thus described my invention what I claim as new and desire to secure as Letters Patent, is:

1. A magnetic device comprising:

a) a layered structure comprising a first layer of a non-magnetic conductor, a second layer of a first magnetic conducting material having a fixed magnetic moment, a third layer of a non-magnetic conductor, a fourth layer of a second magnetic conducting material having a changeable magnetic moment and a fifth layer of a non-magnetic conductor wherein said first and fifth layers are electrodes for passing an electrical current through said device perpendicular to the interfaces between said layers, and     b) a current supply connected to said first and fifth layers for passing an electric current through said second, third and fourth layers for switching said changeable magnetic moment of said fourth layer.

2. The device of claim 1 wherein each of said non-magnetic conductors is a metal selected from the group comprising Cu, Au, Ag, and Al.

3. The device of claim 1 wherein said first magnetic conducting layer comprises a two-layer composite of an anti-ferromagnetic biasing sublayer plus a polarizing sublayer of a ferromagnetic material.

4. The device of claim 3 wherein said anti-ferromagnetic layer is MnFe.

5. The device of claim 3 wherein said ferromagnetic material is one selected from the group comprising the elements Fe, Ni, Co and alloys including said elements.

6. The device of claim 1 wherein said first magnetic conducting material comprises a single layer of a permanent magnetic material.

7. The device of claim 6 wherein said permanent magnetic material is one selected from the group comprising BiMn, Alnico, or $RCo_5$ where R=Y, La, Pr, Nd or Sm.

8. The device of claim 1 wherein at least one of said second layer of a first magnetic conducting material and said fourth layer of a second magnetic conducting material comprise a single layer of a permanent-magnetic material having a spin polarizability equal to or greater than about 0.6.

9. The device of claim 8 wherein said material is one selected from the group comprising $Fe_3O_4$, $CrO_2$ and NiMnSb.

10. The device of claim 1 wherein said fourth layer has a thickness between about 1 nm and about 10 nm.

11. The device of claim 1 wherein the saturation magnetizations $M_{S1}$ and $M_{S2}$ and thicknesses w1 and w2 of the two layers of magnetic material satisfy the inequality $M_{S1}w_1 \gg M_{S2}w_2$.

12. The device of claim 1 wherein said fourth layer of a second magnetic conducting material is one selected from the group comprising $Fe_3O_4$, $CrO_2$ and NiMnSb.

13. The device of claim 1 wherein the thickness of said third layer of a non-magnetic conductor is less than the spin diffusion length of the conduction electrons therein.

14. The device of claim 1 wherein the thickness of said third layer is between about 3 nm and about 1000 nm.

15. The device of claim 1 wherein the passage of a current pulse having an amplitude greater than the value given by equation (1A) passes through said device thereby causing a switching of the magnetization direction of the second magnetic conducting material.

16. A magnetic device comprising:

a) a layered structure comprising a first layer of a non-magnetic conductor, a second layer of a first magnetic conducting material having a fixed magnetic moment, a third layer of a non-magnetic conductor, and a fourth layer of a second magnetic conducting material having a changeable magnetic moment and further including a non-magnetic conductor connecting region in contact with said third layer wherein said first layer and said region are electrodes for passing an electrical current through said device perpendicular to the interfaces between said first, second and third layers, and b) a current supply connected to said first layer and said connecting region for passing an electric current through said second and third layers to switch said changeable magnetic moment of said fourth layer.

17. The device of claim 16 wherein each of said non-magnetic conductors is a metal selected from the group comprising Cu, Au, Ag, and Al.

18. The device of claim 16 wherein said first magnetic conducting layer comprises a two-layer composite of an anti-ferromagnetic biasing sublayer plus a polarizing sublayer of a ferromagnetic material.

19. The device of claim 18 wherein said anti-ferromagnetic material is MnFe.

20. The device of claim 18 wherein said ferromagnetic material is one selected from the group comprising the elements Fe, Ni, Co and alloys including said elements.

21. The device of claim 16 wherein said first magnetic conducting material comprises a single layer of a permanent magnetic material.

22. The device of claim 21 wherein said permanent magnetic material is one selected from the group comprising BiMn, Alnico, or $RCo_5$ where R=Y, La, Pr, Nd or Sm.

23. The device of claim 16 wherein at least one of said second layer of a first magnetic conducting material and said fourth layer of a second magnetic conducting material comprise a single layer of a permanent-magnetic material having a spin polarizability equal to or greater than about 0.6.

24. The device of claim 23 wherein said material is one elected from the group comprising $Fe_3O_4$, $CrO_2$ and NiMnSb.

25. The device of claim 16 wherein said fourth layer has a thickness between about 1 nm and about 10 nm.

26. The device of claim 16 wherein the saturation magnetizations $M_{S1}$ and $M_{S2}$ and thicknesses w1 and w2 of the two layers of magnetic material satisfy the inequality $M_{S1}w_1 \gg M_{S2}w_2$.

27. The device of claim 16 wherein said fourth layer of a second magnetic conducting material is one selected from the group comprising $Fe_3O_4$, $CrO_2$ and NiMnSb.

28. The device of claim 16 wherein the thickness of said third layer of a non-magnetic conductor is less than the scattering length of the conduction electrons therein.

29. The device of claim 16 wherein the thickness of said third layer is between about 3 nm and about 50 nm.

30. The device of claim 16 wherein the passage of a current pulse having an amplitude greater than the value given by equation (2) passes through said device thereby causing a switching of the magnetization direction of the second magnetic conducting material.

31. A device comprising:

a sequentially layered structure comprising a first layer of a non-magnetic conductor, a second layer of a first magnetic conducting material having a fixed magnetic moment, a third layer of a non-magnetic conductor, a fourth layer of a second magnetic conducting material having a changeable magnetic moment, a fifth layer of an insulating material, a sixth layer of a third magnetic conducting material having a fixed magnetic moment and a seventh layer of a non-magnetic conductor and further including a non-magnetic conductor connecting region in contact with said third layer wherein said first and seventh layers and said region are electrodes for passing electrical currents through said device.

32. The device of claim 31 wherein the material of said fifth layer is $Al_2O_3$.

33. The device of claim 31 wherein each of said non-magnetic conductors is a metal selected from the group comprising Cu, Au, Ag, and Al.

34. The device of claim 31 wherein at least one of said first and third magnetic conducting layers comprise a two-layer composite of an anti-ferromagnetic biasing sublayer plus a polarizing sublayer of a ferromagnetic material.

35. The device of claim 34 wherein said anti-ferromagnetic material is MnFe.

36. The device of claim 34 wherein said ferromagnetic material is one selected from the group comprising the elements Fe, Ni, Co and alloys including said elements.

37. The device of claim 31 wherein said first and third magnetic conducting materials each comprise a single layer of a permanent magnetic material.

38. The device of claim 37 wherein said permanent magnetic material is one selected from the group comprising BiMn, Alnico, or $RCo_5$ where R=Y, La, Pr, Nd or Sm.

39. The device of claim 31 wherein at least one of said second layer of a first magnetic conducting material, said fourth layer of a second magnetic conducting material and said sixth layer of a third magnetic conducting material comprise a layer of a permanent-magnetic material having a spin polarizability equal to or greater than 0.6.

40. The device of claim 39 wherein said material is one elected from the group comprising $CrO_2$, $Fe_3O_4$, and NiMnSb.

41. The device of claim 31 wherein said fourth layer has a thickness between about 1 nm and about 10 nm.

42. The device of claim 31 wherein the saturation magnetizations $M_{S1}$ and $M_{S2}$ and thicknesses w1 and w2 of the two layers of magnetic material satisfy the inequality $M_{S1}w_1 \gg M_{S2}w_2$.

43. The device of claim 31 wherein said fourth layer of a second magnetic conducting material is one selected from the group comprising $CrO_2$, $Fe_3O_4$, GdCoMo, Fe and $R'CO_5$ where R'=Gd, Tb, or Dy.

44. The device of claim 31 wherein the thickness of said third layer of a non-magnetic conductor is less than the scattering length of the conduction electrons therein.

45. The device of claim 31 wherein the thickness of said third layer is between about 3 nm and about 50 nm.

46. The device of claim 31 wherein the passage of a current pulse through said first, second and third layers of said device causes a switching of the magnetization direction of said second magnetic material.

47. The device of claim 31 wherein the passage of a current pulse having an amplitude greater than the value given by equation (2) passes through said first, second and third layers of said device thereby causing a switching of the magnetization direction of the second magnetic conducting material.

48. The device of claim 31 wherein the magnetization vectors of the materials of the second and sixth layers are aligned parallel to a common axis.

49. The device of claim 48 wherein the magnetization vectors of the materials of the second and sixth layers are aligned in the same direction and are perpendicular to the interfaces between said first, second and third layers.

50. The device of claim 48 which is a latch.

51. The device of claim 31 wherein the magnetization vectors of the materials of the second and sixth layers are aligned perpendicular to each other and the magnetization vector of the material of said second layer is perpendicular to the interfaces between said first, second and third layers.

52. The device of claim 51 which is an oscillator.

53. The device of claim 31 wherein the magnetization vectors of the materials of the second and sixth layers are aligned parallel to a common axis and perpendicular to the magnetic vector of the fourth layer.

54. The device of claim 53 which is an analog preamplifier.

55. A data storage device comprising:
a) a disk,
b) a stylus for writing information to said disk, and
c) an electric current source connected between said disk and said stylus,
wherein said disk comprises five layers, said first layer is a non-magnetic conductor, said second layer is a first magnetic conducting material having a fixed magnetic moment, said third layer is a non-magnetic conductor, said fourth layer is a second magnetic conducting material having a changeable magnetic moment and said fifth layer is a conducting, lubricating material and said stylus comprises a body of a non-magnetic conductor terminating in a wedge-shaped structure having magnetic shielding material on both slanted faces of said wedge-shaped structure, said current source being connected between said first layer of said disc and said conductor of said stylus.

56. A data storage device comprising:
a) a disk,
b) a stylus for writing information to said disk, and
c) an electric current source connected between said disk and said stylus,
wherein said disk comprises three layers of a first layer of a non-magnetic conductor, a second layer of a first magnetic conducting material having a changeable magnetic moment, and a third layer of a conducting, lubricating material and wherein said stylus comprises a body of a non-magnetic conductor terminating in a wedge-shaped structure having elongated faces terminating in a bottom region, said body being surrounded in said wedge area and thereabove with a layer of a second magnetic conducting material having a fixed magnetic moment and further including a magnetic shielding material on both slanted faces of said wedge-shaped structure, said current source being connected between said first layer of said disc and said layer of said second magnetic conducting material of said stylus.

* * * * *